(12) United States Patent
Lee et al.

(10) Patent No.: US 9,632,438 B2
(45) Date of Patent: Apr. 25, 2017

(54) PHASE SHIFT MASK AND METHOD OF FORMING PATTERNS USING THE SAME

(71) Applicant: SAMSUNG DISPLAY CO., LTD., Yongin, Gyeonggi-Do (KR)

(72) Inventors: DongEon Lee, Seoul (KR); Min Kang, Seoul (KR); Bong Yeon Kim, Seoul (KR); Yong Son, Suwon-si (KR); Junhyuk Woo, Yongin-si (KR); Hyunjoo Lee, Seoul (KR); Jinho Ju, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 176 days.

(21) Appl. No.: 14/604,459

(22) Filed: Jan. 23, 2015

(65) Prior Publication Data
US 2015/0293438 A1   Oct. 15, 2015

(30) Foreign Application Priority Data

Apr. 9, 2014  (KR) .......................... 10-2014-0042458

(51) Int. Cl.
*G03F 1/26* (2012.01)
*G03F 7/20* (2006.01)
*G03F 9/00* (2006.01)

(52) U.S. Cl.
CPC .............. *G03F 9/7003* (2013.01); *G03F 1/26* (2013.01); *G03F 7/2002* (2013.01); *G03F 7/2008* (2013.01); *G03F 7/70191* (2013.01)

(58) Field of Classification Search
CPC ........ G03F 1/26; G03F 7/2002; G03F 7/2008; G03F 7/70191; G03F 9/7003
USPC ............................................... 430/5, 22, 313
See application file for complete search history.

(56) References Cited

U.S. PATENT DOCUMENTS

| 5,591,550 A | 1/1997 | Choi et al. |
| 6,274,281 B1 | 8/2001 | Chen |
| 2004/0175629 A1 | 9/2004 | Wasson et al. |

FOREIGN PATENT DOCUMENTS

| KR | 1997-0028806 | 6/1997 |
| KR | 10-0645220 | 11/2006 |
| KR | 10-2008-0062755 | 7/2008 |

*Primary Examiner* — Christopher Young
(74) *Attorney, Agent, or Firm* — Lewis Roca Rothgerber Christie LLP (57) ABSTRACT

A method of forming a pattern includes: preparing a target substrate including a photoresist layer on a base substrate; aligning a phase shift mask to the target substrate, the phase shift mask including a mask substrate comparted into a first region including a first sub region and second sub regions at sides of the first sub region, and second regions at sides of the first region, the phase shift mask including a phase shift layer on the mask substrate corresponding to the first region; fully exposing the photoresist layer at the first sub region and the second regions by utilizing the phase shift mask; and removing the photoresist layer at the first sub region and the second regions to form first and second photoresist patterns corresponding to the second sub regions. Transmittance of the phase shift layer is selected to fully expose the photoresist layer in the first sub region.

8 Claims, 5 Drawing Sheets

PHASE SHIFT MASK AND METHOD OF FORMING PATTERNS USING THE SAME

CROSS-REFERENCE TO RELATED APPLICATION

This patent application claims priority to and the benefit of Korean Patent Application No. 10-2014-0042458 filed Apr. 9, 2014, in the Korean Intellectual Property Office, the entire content of which is hereby incorporated by reference.

BACKGROUND

Aspects of embodiments of the inventive concept are directed toward a method of forming a pattern, and more particularly, a phase shift mask and a method of forming a pattern using the same.

Flat-panel displays or semiconductor devices are fabricated by evaporating and depositing a variety of materials on substrates. In such devices, patterns of thin films can be directly formed on the substrates or completed by way of transcription with photomask patterns onto the thin films deposited on the substrates. In recent years, because of the demands for high integration density of semiconductor devices and high resolution of flat-panel display devices, deposition masks or photomasks available for deposition or transcription with patterns in high resolution on the substrates are desired.

SUMMARY

Aspects of embodiments of the inventive concept are directed toward a method of forming a pattern capable of shortening an exposure time in an exposure task to enhance resolution.

Other aspects of embodiments of the inventive concept are directed toward a phase shift mask utilized during the method of forming a pattern.

According to an embodiment, a method of forming a pattern includes: preparing a target substrate including a base substrate and a photoresist layer on the base substrate; aligning a phase shift mask to the target substrate, the phase shift mask including a mask substrate comparted into a first region including a first sub region and second sub regions at sides of the first sub region, and second regions at sides of the first region, the phase shift mask includes a phase shift layer on the mask substrate corresponding to the first region, and a plurality of openings respectively corresponding to the second regions on the mask substrate; fully exposing the photoresist layer at the first sub region and the second regions by utilizing the phase shift mask; and removing the photoresist layer at the first sub region and the second regions to form first and second photoresist patterns corresponding to the second sub regions. Transmittance of the phase shift layer is selected to fully expose the photoresist layer in the first sub region.

The first and second sub regions may be symmetrical from a center of the first region.

The transmittance of the phase shift layer may be higher than 45%.

The phase shift layer may be provided as a plurality of phase shift layers with an interval between the phase shift layers, and a width of the interval between the phase shift layers and a width of each of the phase shift layers may be determined by $0.2 \times W2 < W1 < 0.7 \times W2$, where W2 may be the width of the interval between the phase shift layers and W1 may be the width of each of the phase shift layers.

The width of the interval between the phase shift layers may be from 1 μm to 8 μm.

An amount of exposure light utilized to expose the photoresist layer may be lower than 45 mJ.

The phase shift layer may be configured to invert a phase of light.

The target substrate may further include an etch target layer interposed between the base substrate and the photoresist layer, and the method may further include etching the etch target layer with a mask of the first and second photoresist patterns.

According to another embodiment, a phase shift mask includes: a mask substrate comparted into a first region and a plurality of second regions at sides of the first region; and a phase shift layer on the mask substrate corresponding to the first region, and transmittance of the phase shift layer is higher than 45%.

The phase shift layer may be provided as a plurality of phase shift layers with an interval between the phase shift layers, and a width of the interval between the phase shift layers and a width of each of the phase shift layers may be determined by $0.2 \times W2 < W1 < 0.7 \times W2$, where W2 is the width of the interval between the phase shift layers and W1 is the width of each of the phase shift layers.

The width of the interval between the phase shift layers may be from 1 μm to 8 μm.

The phase shift layer may be configured to invert a phase of light.

According to another embodiment, a system of forming a pattern includes: means for preparing a target substrate including a base substrate and a photoresist layer on the base substrate; means for aligning a phase shift mask to the target substrate, the phase shift mask includes a mask substrate comparted into a first region including a first sub region and second sub regions at sides of the first sub region, and second regions at sides of the first region, the phase shift mask includes a phase shift layer on the mask substrate corresponding to the first region, and a plurality of openings respectively corresponding to the second regions on the mask substrate; means for fully exposing the photoresist layer at the first sub region and the second regions by utilizing the phase shift mask; and means for removing the photoresist layer at the first sub region and the second regions to form first and second photoresist patterns corresponding to the second sub regions, and transmittance of the phase shift layer is selected to fully expose the photoresist layer in the first sub region.

The target substrate may further include an etch target layer interposed between the base substrate and the photoresist layer, and the system may further include: means for etching the etch target layer with a mask of the first and second photoresist patterns.

BRIEF DESCRIPTION OF THE DRAWINGS

The above and other aspects and features will become apparent from the following description with reference to the following figures, wherein like reference numerals refer to like elements throughout the various figures, unless otherwise specified, and wherein.

DETAILED DESCRIPTION

Embodiments will be described in more detail with reference to the accompanying drawings. The inventive concept, however, may be embodied in various different forms, and should not be construed as being limited to only the illustrated embodiments herein. Rather, these embodiments are provided as examples so that this disclosure will be thorough and complete, and will fully convey aspects of the inventive concept to those skilled in the art. Accordingly, processes, elements, and techniques that are not necessary for a complete understanding of the aspects of the inventive concept to those skilled in the art are not described with respect to some of the embodiments of the inventive concept. Unless otherwise noted, like reference numerals denote like elements throughout the attached drawings and written description, and thus, descriptions will not be repeated. In the drawings, the relative sizes of elements, layers, and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Now hereinafter will be described example embodiments of the inventive concept with reference to the accompanying drawings.

FIGS. 1A through 1D illustrate a method of forming patterns in accordance with an embodiment of the inventive concept.

Figure 1A:
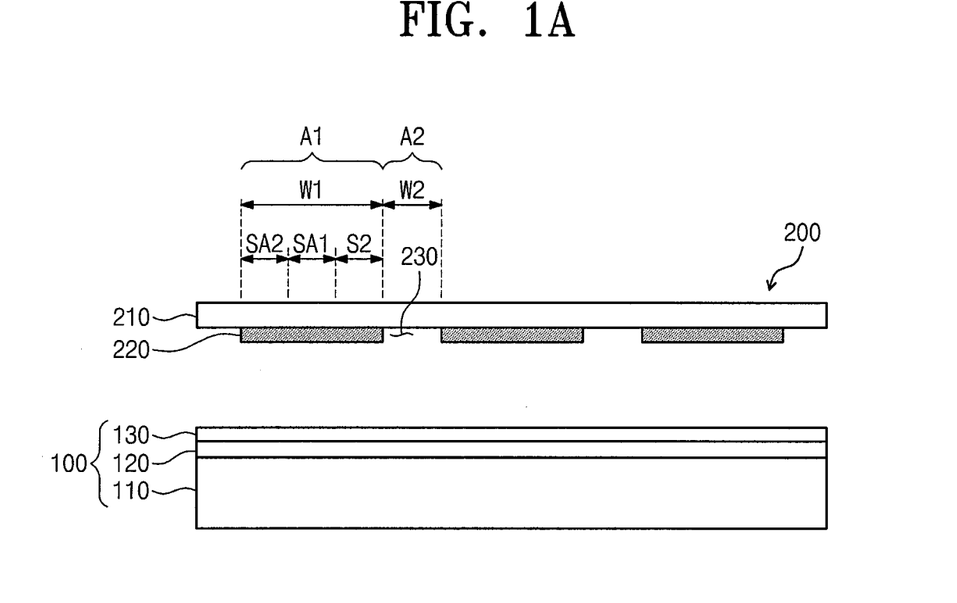
FIGS. 1A through 1D illustrate a method of forming patterns in accordance with an embodiment of the inventive concept.

Referring to FIG. 1A, an etch target layer 120 is formed all over a base substrate 110. In an embodiment of the inventive concept, the etch target layer 120 may be formed of a material for forming connection lines or pixel electrodes of a display panel. However, the material forming the etch target layer 120 may not be restrictive hereto, and may be embodied in various forms therefor. For example, the etch target layer may be formed of a material capable of being patterned by a photolithography process.

A photoresist layer 130 is formed all over the etch target layer 120. The photoresist layer 130 contains a photosensitive material. If light with intensity higher than an exposure critical level is irradiated on the photoresist layer 130, the photoresist layer 130 is fully exposed. If light with intensity lower than the exposure critical level is irradiated on the photoresist layer 130, the photoresist layer 130 is not fully exposed.

The tem "fully exposed" relates to that the exposure is entirely completed from the surface of the photoresist layer 130, on which light is irradiated, to the counter surface. Therefore, if the photoresist layer 130 is developed after fully exposing a part of the photoresist layer 130, the fully exposed part of the photoresist layer 130 is completely or substantially removed.

As such, after forming the base substrate 110, and the etch target layer 120 and the photoresist layer 130 in sequence, the base substrate 110, the etch target layer 120, and the photoresist layer 130 constitute a target substrate 100.

Thereafter, a phase shift mask 200 is aligned on the target substrate 100.

The phase shift mask 200 includes a mask substrate 210, a plurality of phase shift layers 220, and a plurality of openings 230.

The mask substrate 210, for example, may be provided with a transparent material such as quartz. The mask substrate 210 may be comparted into a first region A1 and a second region A2. In an embodiment of the inventive concept, the first and second regions A1 and A2 are prepared in plurality. The first and second regions A1 and A2 are arranged alternately. FIGS. 1A through 1D show three of the first regions A1 as an example, but the others of the first regions A1 are omitted for convenience of illustration. In this case, the second regions A2 are respectively between the first regions A1.

The phase shift layers 220 are provided to correspond with the first regions A1 on the mask substrate 210. FIGS. 1A through 1D show three of the phase shift layers 220 in correspondence with the illustrated number of the first regions A1 as examples, and the others of the phase shift layers are omitted for convenience of illustration. The phase shift layers 220 are arranged with an interval (e.g., a predetermined interval) in correspondence with the first regions A1, with the second regions A2 interposed therebetween.

The phase shift layer 220 contains a phase shift material for changing a phase of light. For example, the phase shift layer 220 may include a phase shift material such as chrome oxide (CrOx) or molybdenum silicide. In this case, the phase shift layer 220 transmits incident light by partly shifting a phase of the incident light. In an embodiment of the inventive concept, the phase shift layer 220 is capable of reversing the incident light in phase.

In an embodiment of the inventive concept, the transmittance of the phase shift layer 220 is higher than about 45% (e.g., greater than 45%). The transmittance of the phase shift layer 220 will be further described with reference to FIG. 3.

The openings 230 are defined by isolation regions between the phase shift layers 220. In more detail, as the isolation regions of the phase shift layers 220 correspond to the second regions A2, the openings 230 are provided one by one at the second regions A2.

The phase shift layer 220 is configured with a first width W1, and the isolation region between the phase shift layers 220 is configured with a second width W2. The second width W2 may be the same or substantially the same as a width of the second region A2. In this case, the first and second widths W1 and W2 are conditioned to (e.g., determined to) be about 0.2×W2<W1<0.7×W2 (e.g., W1 is between 0.2× W2 and 0.7×W2). Additionally, the second width W2 may be about 1 µm to about 8 µm (e.g., not less than 1 µm and not greater than 8 µm or from 1 µm to 8 µm).

Figure 1B:
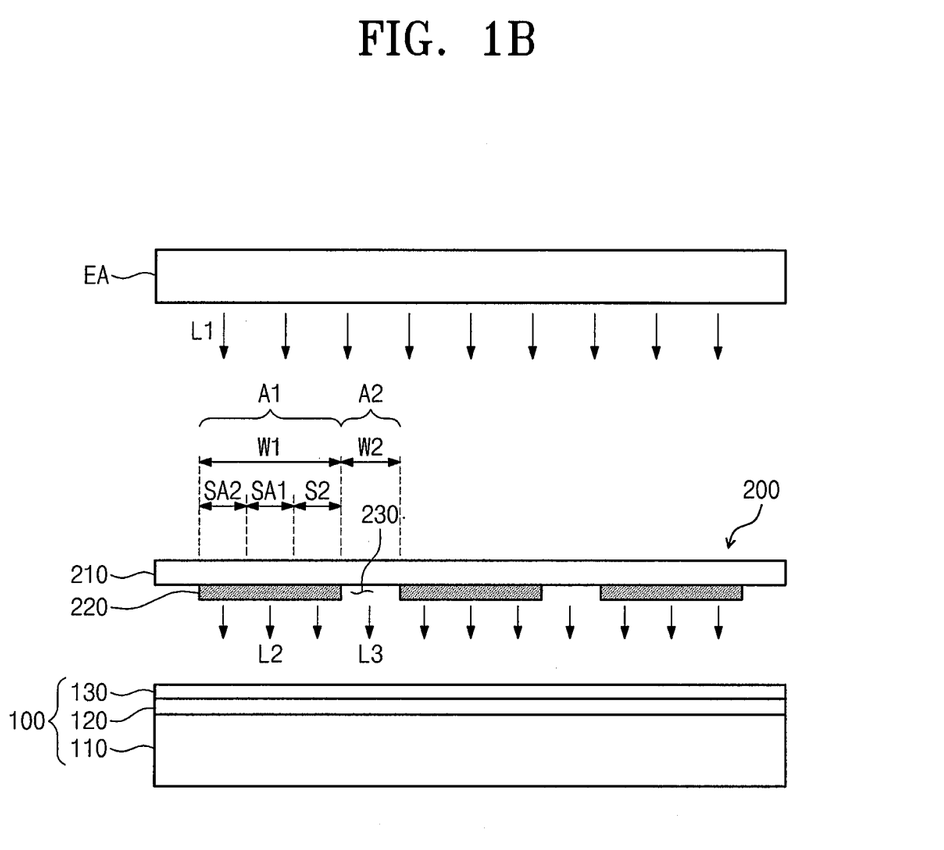

As shown in FIG. 1B, the photoresist layer 130 is exposed through an exposure system EA.

The exposure system EA is disposed over the phase shift mask 200 to irradiate a first light L1 onto the phase shift mask 200. A wavelength of the first light L1 may be, for example, about 300 nm to about 450 nm (e.g., from 300 nm to 450 nm). In an embodiment of the inventive concept, the first light L1 may include three lights with different wavelengths. These three lights may include a G line having a wavelength of about 435 nm, an H line having a wavelength of about 405 nm, and an I line having a wavelength of about 365 nm. An exposure quantity of the first light L1 provided by the exposure system EA may be less than about 45 mJ.

The phase shift layer 220 inverts a phase of the first light L1 that is incident on the first regions A1, and shifts the first light L1 to the second light L2. The openings 230 directly transmit the first light L1 that is incident on the second regions A2. For convenience of description, the first light L1 transmitted through the openings 230 will be hereinafter defined as "a third light L3". The second light L2 and the third light L3 are overlapped to interfere with each other. For convenience of description, light provided from the second and third lights L2 and L3 will be hereinafter referred to as "an overlap light".

Figure 2:
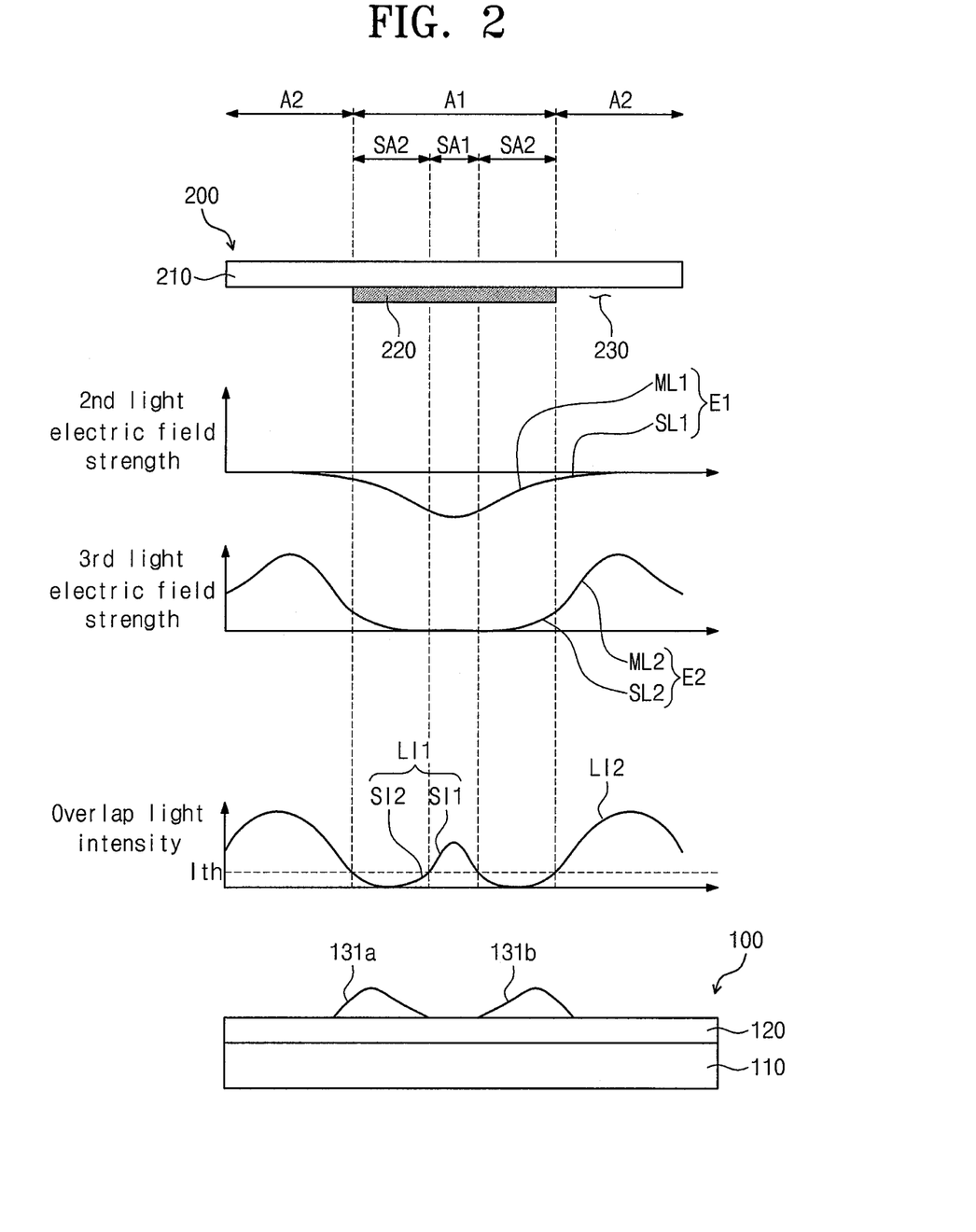
FIG. 2 illustrates an overall electric field profile and an intensity profile of light on the photoresist layer shown in FIG. 1B.

FIG. 2 illustrates electric field profiles of the second and third lights and an intensity profile of the overlap light on the photoresist layer shown in FIG. 1B. FIG. 2 explosively shows a part corresponding to one of the phase shift layers 220 shown in FIG. 1B.

Referring to FIG. 2, the electric field profile on the photoresist layer 130 includes a first electric field profile E1 and a second electric field profile E2. The first electric field profile E1 represents a distribution of electric field strength for the second light L2 on the photoresist layer 130. The second electric field profile E2 represents a distribution of electric field strength for the third light L3 on the photoresist layer 130.

Since a phase of the second light L2 is comparatively invert to the phase of the first light L1, the first electric field profile E1 may be represented as a negative value. As the second light L2 is diffracted while progressing toward the photoresist layer 130, the electric field strength of the second light L2 on the photoresist layer 130 is distributed as represented by the first electric field profile E1. The first electric field profile E1 includes a first main lobe ML1 and a first side lobe SL1. The first main lobe ML1 is located in the first region A1, and the first side lobe SL1 is located in the second region A2 adjacent to the first region A1. A size of the first main lobe ML1 gradually decreases away from the center of the first region A1. The first side lobe SL1 is smaller than the first main lobe ML1 in size.

Since a phase of the third light L3 is the same or substantially the same as that of the first light L1, the second electric field profile E2 may be represented as a positive value. As the third light L3 is also diffracted while progressing toward the photoresist layer 130, the electric field strength of the third light L3 on the photoresist layer 130 is distributed as represented by the second electric field profile E2. The second electric field profile E2 includes a second main lobe ML2 and a second side lobe SL2. The second main lobe ML2 is located in the second region A2 and the second side lobe SL2 is located in the first region A1 adjacent to the second region A2. A size of the second main lobe ML2 gradually decreases away from the center of the second region A2. The second side lobe SL2 is smaller than the second main lobe ML2 in size.

The overlap light intensity profile represents an intensity distribution of the overlap light on the photoresist layer 130. The intensity of the overlap light is a square of a sum of the second and third lights L2 and L3. As the second light L2 is invert to the second light L3 in phase, the second and third lights L2 and L3 interfere with and cancel each other. In more detail, the second main lobe ML2 interferes with and cancels the first side lobe SL1 in the second regions A2, and the first main lobe ML1 interferes with and cancels the second side lobe SL2 in the first region A1.

The light intensity profile on the photoresist layer 130 includes a first light intensity LI1 and a second light intensity LI2.

The first light intensity LI1 propagates at the first region A1, and includes a first sub light intensity SI1 and a second sub light intensity SI2. The first sub light intensity SI1 propagates at a first sub region SA1 of the first region A1, and gradually decreases away from the center of the first sub region SA1. The first sub light intensity SI1 may be higher than the exposure critical level. As a result, the photoresist layer 130 in the first sub region SA1 is fully exposed. As described below, the transmittance and the first width W1 of the phase shift layer 220 are determined to allow the first sub light intensity SI1 to be higher than the exposure critical level.

The second sub light intensity SI2 propagates at the second sub regions SA2 of the first region A1, and is not higher than the exposure critical level. As a result, the photoresist layer 130 in the second sub region SA2 is not fully exposed.

The second sub regions SA2 may be, for example, located at both sides of the first sub region SA1. In an embodiment of the inventive concept, the first sub region SA1 and the second sub regions SA2 at the sides of the first sub region SA1 may be symmetrical from the center of the first region A1 in the first region A1.

The second light intensity LI2 propagates at the second regions A2, and gradually decreases away from the center of the second regions A2. The second light intensity LI2 may be higher than the exposure critical level throughout most areas of the second regions A2. Therefore, the photoresist layer 130 in the second region A2 is fully exposed.

Figure 1C:
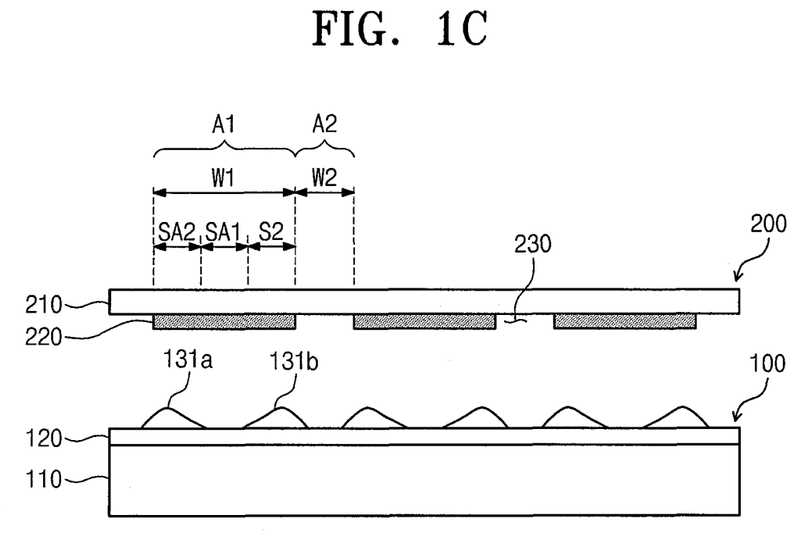

Thereafter, as shown in FIGS. 1C and 2, after developing the photoresist layer 130 (see FIG. 1B), the photoresist layer 130 is removed from the first sub region SA1 and the second region A2 to form a plurality of first and second photoresist patterns 131a and 131b on the etch target layer 120. The first and second photoresist patterns 131a and 131b are formed on the etch target layer 120, corresponding to the second sub regions SA2 one by one. In other words, on the etch target layer 120, the first and second photoresist patterns 131a and 131b are respectively formed in correspondence with the phase shift layers 220.

Figure 1D:
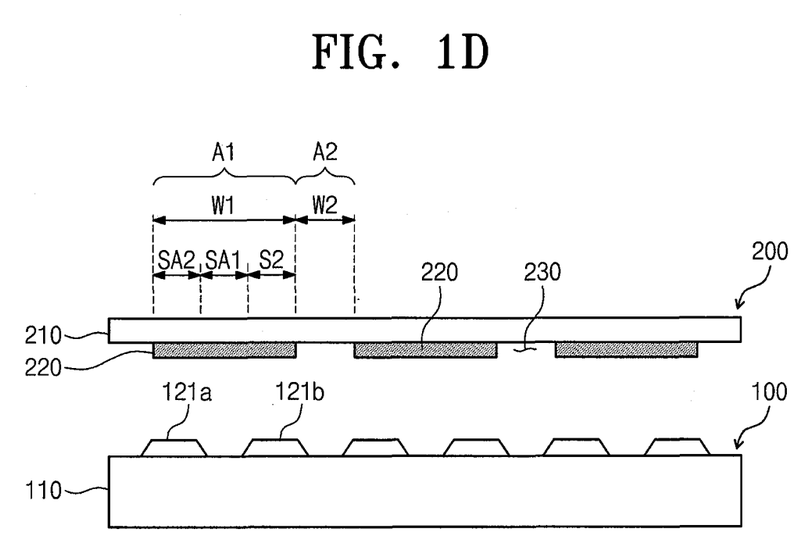

Then, when the first and second photoresist patterns 131a and 131b are removed after etching the etch target layer 120 with a mask of (e.g., formed or defined by) the first and second photoresist patterns 131a and 131b, pluralities of first and second target patterns 121a and 121b are formed on the base substrate 110 as shown in FIG. 1D. The first and second target patterns 121a and 121b are formed on the base substrate 110, corresponding to the second sub regions SA2 one by one. In other words, on the base substrate 110, the first and second target patterns 121a and 121b are formed in correspondence with the phase shift layers 220.

In an embodiment of the inventive concepts, as the first sub region SA1 and the second sub region SA2 are symmetrical on the first region A1, the first and second target patterns 121a and 121b are also symmetrical with each other on the first region A1.

Summarily, by the phase shift layers 220 provided in the first regions A1, the photoresist layer 130 is fully exposed in the first sub region SA1 and the second region A2, and not in the second sub region SA2. After development and etching processes, the first and second target patterns 121a and 121b are formed in correspondence respectively with the first regions A1. As a result, since the first and second target patterns 121a and 121b are formed on the base substrate 110 in correspondence respectively with the phase shift layers 220, the first and second target patterns 121a and 121b can be patterned more minutely than the phase shift layer 220. Therefore, it is possible to form patterns with higher resolution than that of the phase shift mask.

The profile of the first light intensity LI1 may determine the first and second target patterns 121a and 121b in shape, arrangement, and width. The profile of the first light intensity LI1 may be determined by the transmittance of the phase shift layer 220, the first width W1 of the phase shift layer 220, and the second width W2 of the interval between the phase shift layers 220. Hereinafter FIG. 3 will be referred to for description.

Figure 3:
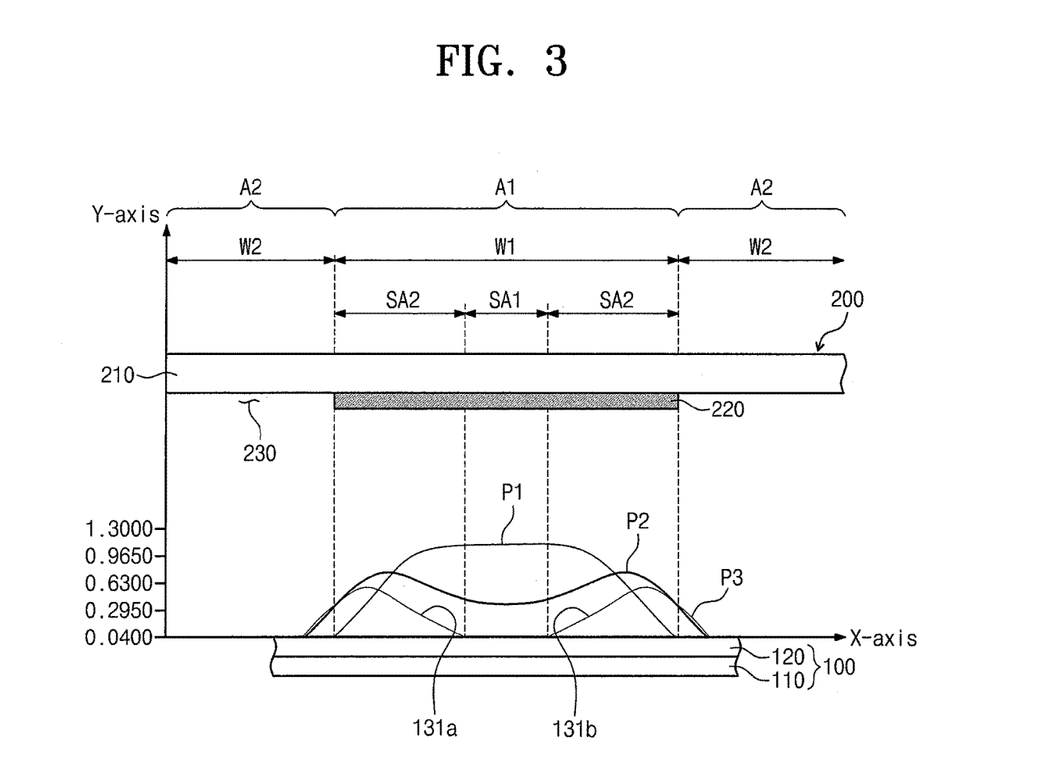
FIG. 3 illustrates patterns formed according to embodiments of the inventive concept.

FIG. 3 illustrates patterns formed according to embodiments of the inventive concept. In FIG. 3, the X axis indicates positions on the etch target layer 120 and the Y axis indicates heights from the top of the etch target layer 120. FIG. 3 shows first through third patterns P1~P3. The first pattern P1 is formed on the etch target layer 120 after patterning the photoresist layer 130 (see FIG. 1B) by using (or utilizing) the phase shift mask 200 including the phase shift layer 220 having transmittance of 5.1%. The second pattern P2 is formed on the etch target layer 120 after patterning the photoresist layer 130 by using the phase shift mask 200 including the phase shift layer 220 having transmittance of 40%. The third pattern P3 is formed on the etch target layer 120 after patterning the photoresist layer 130 by using the phase shift mask 200 including the phase shift layer 220 having transmittance of 50%. Here, in embodiments, the first width W1 of the phase shift layer 220 is 4 µm and the sum of the second widths W2 of the intervals at sides of the phase shift layers 220 is 4 µm.

The first pattern P1 is formed in correspondence with the first region A1, not including any divided pattern. The second pattern P2 is concaved in the first sub region SA1, but having a successive pattern throughout the first region A1 without a divided pattern. For the third pattern P3, the photoresist layer 130 is completely etched away from the first sub region SA1. In other words, the third pattern P3 has the first and second photoresist patterns 131a and 131b formed corresponding to the second sub region A1. If the phase shift layer 220 has transmittance of about 40% to about 50% (e.g., from 40% to 50%), divided patterns corresponding to one of the phase shift layers 220, e.g., the first and second photoresist patterns 131a and 131b, is formed in the first region A1.

As such, by adjusting transmittance of the phase shift layer 220 in accordance with the first and second widths W1 and W2, the first and second target patterns 121a and 121b can be formed in correspondence with one of the phase shift layers 220. Therefore, when forming patterns with the phase shift mask 200 in accordance with an embodiment of the inventive concept, patterns with higher resolution than that of the phase shift mask 200 may be provided.

Additionally, according to an embodiment of the inventive concept, since the transmittance of the phase shift layer 220 is higher than about 45% (e.g., greater than 45%), it is possible to implement even with a very small amount of exposure. In more detail, as an existing phase shift layer has very low transmittance, a large amount of exposure is used (or utilized) to form desired patterns with a phase shift mask, and the large amount of exposure could be obtained by irradiating light for a long exposure time. Such a long exposure time causes a production yield to be reduced. In contrast, since embodiments of the inventive concept use (or utilize) the phase shift layer 220 with relatively high transmittance, even a small amount of exposure may form desired patterns. As a result, it is possible to shorten an exposure time, and thus, improving a production yield.

As described above, when exposing a photoresist layer by using (or utilizing) the phase shift mask of embodiments of the inventive concept, light with intensity higher than the exposure critical level to the photoresist layer is irradiated on the first region corresponding to the phase shift layer. After the exposure and development tasks with the light, a plurality of the photoresist patterns is formed in the first region. Consequently, owing to a plurality of the photoresist patterns in correspondence with one phase shift layer, patterns may be formed with higher resolution than that of the phase shift mask, hence improving resolution for the pattern forming method with the phase shift mask.

While the inventive concept has been described with reference to example embodiments, it will be apparent to those skilled in the art that various changes and modifications may be made without departing from the spirit and scope of the present invention. Therefore, it should be understood that the above embodiments are not limiting, but illustrative, and the spirit and scope of the present invention being defined by the following claims, and equivalents thereof.

What is claimed is:

1. A method of forming a pattern, the method comprising:
preparing a target substrate comprising a base substrate and a photoresist layer on the base substrate;
aligning a phase shift mask to the target substrate, the phase shift mask comprising a mask substrate comparted into a first region including a first sub region and second sub regions at sides of the first sub region, and second regions at sides of the first region, the phase shift mask comprising a phase shift layer on the mask substrate corresponding to the first region, and a plurality of openings respectively corresponding to the second regions on the mask substrate;
fully exposing the photoresist layer at the first sub region and the second regions by utilizing the phase shift mask; and
removing the photoresist layer at the first sub region and the second regions to form first and second photoresist patterns corresponding to the second sub regions,
wherein transmittance of the phase shift layer is selected to fully expose the photoresist layer in the first sub region.

2. The method according to claim 1, wherein the first and second sub regions are symmetrical from a center of the first region.

3. The method according to claim 1, wherein the transmittance of the phase shift layer is higher than 45%.

4. The method according to claim 3, wherein the phase shift layer is provided as a plurality of phase shift layers with an interval between the phase shift layers,
wherein a width of the interval between the phase shift layers and a width of each of the phase shift layers are determined by $0.2 \times W2 < W1 < 0.7 \times W2$,
where W2 is the width of the interval between the phase shift layers and W1 is the width of each of the phase shift layers.

5. The method according to claim 4, wherein the width of the interval between the phase shift layers is from 1 μm to 8 μm.

6. The method according to claim 1, wherein an amount of exposure light utilized to expose the photoresist layer is lower than 45 mJ.

7. The method according to claim 1, wherein the phase shift layer is configured to invert a phase of light.

8. The method according to claim 1, wherein the target substrate further comprises an etch target layer interposed between the base substrate and the photoresist layer, and
the method further comprises: etching the etch target layer with a mask of the first and second photoresist patterns.

* * * * *